United States Patent [19]

Nebe

[11] 4,029,505
[45] June 14, 1977

[54] METHOD OF PRODUCING POSITIVE POLYMER IMAGES

[75] Inventor: William John Nebe, Wilmington, Del.

[73] Assignee: E. I. Du Pont de Nemours and Company, Wilmington, Del.

[22] Filed: May 20, 1976

[21] Appl. No.: 688,479

Related U.S. Application Data

[63] Continuation-in-part of Ser. No. 542,566, Jan. 20, 1975, abandoned, which is a continuation-in-part of Ser. No. 384,501, Aug. 1, 1973, abandoned.

[52] U.S. Cl. .............................. 96/35.1; 96/27 E; 96/28; 96/45.2; 96/86 P; 96/87 R; 204/159.18; 204/159.23

[51] Int. Cl.$^2$ ................ G03C 5/00; G03C 5/04; G03C 1/68

[58] Field of Search ......... 96/27, 35.1, 45.2, 115 P, 96/115 R, 28; 204/159.18, 159.23

[56] References Cited

UNITED STATES PATENTS

| | | | |
|---|---|---|---|
| 3,203,801 | 8/1965 | Heiart | 96/87 |
| 3,625,696 | 12/1971 | Krauch et al. | 96/86 P |
| 3,740,224 | 6/1975 | Barzynski et al. | 96/33 |
| 3,953,444 | 4/1976 | Singh et al. | 260/250 AC |

OTHER PUBLICATIONS

B367,305, Mar. 1976, Ciurca et al., 96/54.
Chem. Abstracts, vol. 60, 3121g (1964).
Hartel, Chimia, 19 pp. 116–120 (1965).
Tyudesh et al., Kinetics and Catalysts, (USSR), vol. 6, pp. 175–181 (1965).
Bluhm et al., Nature, vol. 215 pp. 1478–1479 (1967).

*Primary Examiner*—Jack P. Brammer

[57] ABSTRACT

Positive polymer images are produced on substrates having applied thereto a layer of photopolymerizable composition containing (1) a non-gaseous ethylenically unsaturated compound capable of polymerization by free-radical initiated chain propagation, (2) a dinitroso compound which is a noninhibitor of free-radical polymerization and is photochemically converted by ultraviolet radiation to an inhibitor of free-radical polymerization, and (3) a photoactivatable organic free-radical generating system. These images are produced by imagewise exposing a portion of the photopolymerizable layer through a transparency bearing an opaque image to ultraviolet radiation that converts the dinitroso compound to an inhibitor of free-radical polymerization, exposing a greater portion of the photopolymerizable layer, including the area exposed to the imagewise exposure radiation, to actinic radiation that activates the free-radical generating system but does not convert the dinitroso compound to an inhibitor of free-radical polymerization, whereby a positive polymeric image is formed in the areas not exposed to the imagewise exposure radiation.

28 Claims, No Drawings

METHOD OF PRODUCING POSITIVE POLYMER IMAGES

CROSS-REFERENCE TO RELATED APPLICATION

This is a continuation-in-part of my copending application Ser. No. 542,566, filed Jan. 20, 1975, now abandoned, which is in turn a continuation-in-part of my copending application, Ser. No. 384,501, filed Aug. 1, 1973, now abandoned.

BACKGROUND OF THE INVENTION

1. Field of the Invention

This invention relates to a method of producing positive images using photopolymerizable compositions containing compounds having a dinitroso group, and more particularly to such a method involving two exposures to radiation.

2. Description of the Prior Art

It is known that certain aromatic nitroso compounds are useful as polymerization inhibitors. For example, Hungarian Pat. No. 150,550 (1963) describes the use of p-aminonitrosobenzene and α-nitroso-β-naphthol as inhibitors for the free-radical polymerization of styrene. Similarly, the use of 4-nitrosophenol, 1,4-dinitrosobenzene, nitrosoresorcinol, p-nitrosodimethylaniline and other nitroso compounds as inhibitors for styrene and vinyl acetate polymerizations is described by Hartel in Chimia (Aarau), 19, p. 116 (1965), and Tyudesh et al., in Kinetics and Catalysis (USSR), 6, p. 175–181 (1965).

It is also known that aliphatic nitroso dimers can be dissociated to nitroso monomers, either thermally or by irradiation with short wavelength ultraviolet radiation (Bluhm and Weinstein, Nature, 215, p. 1478, 1967).

SUMMARY OF THE INVENTION

It has now been discovered that positive polymer images can be produced on a substrate by the process which comprises a. applying to the substrate a layer of photopolymerizable composition containing (1) non-gaseous ethylenically unsaturated compound capable of addition polymerization by free-radical initiated chain propagation, (2) about 0.1–10% by weight, based on the photopolymerizable composition, of a compound containing a dinitroso group which is a noninhibitor of free-radical polymerization and is photochemically converted by ultraviolet radiation to an inhibitor of free-radical polymerization, and (3) about 0.001–1.0 part by weight, per part of unsaturated compound, of an organic free-radical generating system activatable by actinic radiation that does not convert the dinitroso compound to an inhibitor of free-radical polymerization, b. imagewise exposing a portion of the photopolymerizable layer through an image-bearing transparency consisting solely of substantially opaque and substantially transparent areas to ultraviolet radiation that converts the dinitroso compound to an inhibitor of free-radical polymerization, thereby inhibiting photopolymerization in the exposed areas, c. exposing a greater portion of the photopolymerizable layer, including the areas exposed to the imagewise exposure radiation, to actinic radiation that activates the free-radical generating system but does not convert the dinitroso compound to an inhibitor of free-radical polymerization, whereby a positive polymeric image is formed in the areas not exposed to the imagewise exposure radiation.

DESCRIPTION OF THE PREFERRED EMBODIMENTS

In accordance with the present invention positive polymeric images are produced by a two-exposure process. The first exposure is an imagewise exposure which photochemically produces polymerization inhibitor in the exposed areas and the second exposure is an overall actinic radiation exposure which causes photopolymerization in the areas not exposed to the imagewise exposure radiation.

This invention is based on the fact that compounds containing dinitroso groups are not free-radical polymerization inhibitors, but are photochemically converted to inhibitors of free-radical polymerization by exposure to ultraviolet radiation having wavelengths of about 2000–3400A, and in some cases about 2000–3800A. The actinic radiation exposure is conducted using radiation that includes wavelengths which activate the free-radical generating system but does not include wavelengths which photochemically convert the dinitroso compound to inhibitor.

The specific wavelengths which effect conversion of the dinitroso compound depend on the particular dinitroso compound involved. Generally, the wavelengths which cause this result are less than about 3400A, in which case the actinic radiation exposure is done with radiation substantially limited to wavelengths greater than about 3400A. In the case of certain aromatic dinitroso compounds, wavelengths up to about 3800A effect this result, and thus the actinic radiation exposure is carried out using radiation substantially limited to wavelengths greater than about 3800A.

During the actinic radiation exposure free-radicals are generated in the area struck by the imagewise exposure radiation just as they are in the other areas struck by the actinic radiation. In the area struck by the imagewise exposure, however, the inhibitor formed by irradiation of the dinitroso compound interferes with the normal free-radical induced polymerization process.

Although the nature of the inhibitor formed by the photochemical conversion of the dinitroso compound is not in all cases fully understood, it is believed to be a nitroso monomer, a nitroxide or nitric oxide. Most commonly, the dinitroso compound is in thermal equilibrium with a mononitroso compound. The dinitroso compounds which are subject to this equilibrium are referred to herein as "nitroso dimers" and the equilibrium mononitroso compounds are referred to as "nitroso monomers". The nitroso dimer is converted to the nitroso monomer by ultraviolet radiation.

In those cases where the inhibiting species is nitroso monomer, it is believed that the nitroso monomer reacts with free-radicals or with photoactivated nitroso monomer to form stable nitroxide radicals which do not propagate the free-radical chain process and hence serve as efficient chain terminators. The processes believed to be operating are outlined in equations 1–3, wherein

represents a typical nitroso dimer and RNO* represents a photoexcited nitroso monomer species

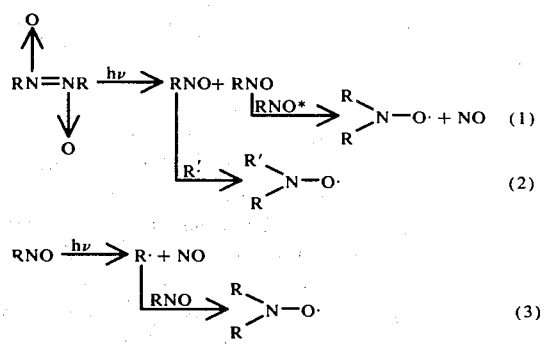

Thus, upon generation of free radicals in the areas struck by the imagewise radiation, either during the imagewise exposure or the actinic radiation exposure, the inhibitor species reacts with at least some of the free radicals to form inhibiting nitroxide radicals and polymerization does not take place in these areas. When portions of the photopolymerizable layer not exposed to the imagewise exposure radiation are exposed to actinic radiation substantially limited to wavelengths greater than those that cause photochemical conversion of the dinitroso compound, the photoinitiator system operates to produce initiating radicals. These radicals are able to effect chain propagation in the usual way and polymerization can occur.

The photopolymerizable coating compositions used in accordance with this invention must contain (1) the unsaturated compound, (2) the photochemically convertible dinitroso compound and (3) the organic free-radical generating system. Suitable unsaturated compounds are the non-gaseous ethylenically unsaturated compounds capable of addition polymerization by free-radical initiated chain propagation described in Burg et al., U.S. Pat. No. 3,060,023; Martin et al., U.S. Pat. No. 2,927,022; and Hertler, Belgian Pat. No. 769,694. The photocrosslinkable polymers disclosed in Schoenthaler, U.S. Pat. No. 3,418,295, and Celeste, U.S. Pat. No. 3,448,089, may also be used. They are preferably monomeric, have a boiling point above 90° C. at normal atmospheric pressure, and contain at least one terminal ethylenic group, but may contain 2–5 terminal ethylenic groups. Monomers which contain three terminal ethylenic groups are particularly preferred.

Suitable unsaturated compounds include unsaturated esters of polyols, particularly such esters of α-methylene-carboxylic acids, for example, ethylene glycol diacrylate, diethylene glycol diacrylate, glycerol diacrylate, glyceryl triacrylate, mannitol polyacrylate, sorbitol polyacrylates, ethylene glycol dimethacrylate, 1,3-propanediol dimethacrylate, 1,2,4-butanetriol trimethacrylate, trimethylolpropane triacrylate, triethylene glycol diacrylate, 1,4-cyclohexanediol diacrylate, 1,4-benzenediol dimethacrylate, pentaerythritol di-, tri-, and tetramethacrylate, dipentaerythritol polyacrylate, pentaerylthritol di-, tri-, and tetraacrylates, 1,3-propanediol diacrylate, 1,5-pentanediol dimethacrylate, the bis-acrylates and methacrylates of polyethylene glycols of molecular weight 200–4000, and the like; unsaturated amides, particularly those of α-methylenecarboxylic acids, and especially those of α,ω- and oxygen-interrupted ω-diamines such as methylene bis-acrylamide, methylene bis-methacrylamide, ethylene bis-methacrylamide, 1,6-hexamethylene bis-acrylamide, bis-(γ-methacrylamidopropoxy)ethane and β-methacrylamidoethyl methacrylate; vinyl esters such as divinyl succinate, divinyl adipate, divinyl phthalate, divinyl terephthalate, divinyl benzene-1,3-disulfonate and divinyl butane-1,4-disulfonate; styrene and derivatives thereof; unsaturated aldehydes, such as hexadienal; and the like.

A preferred group of unsaturated compounds, because of the good physical properties of compositions containing them, include
N-phenyl-N-methylacrylamide,
N-vinylphthalimide,
diacetone acrylamide,
N-vinylsuccinimide,
p-xylylene diacrylate,
1,4-bis(2-acryloxyethyl)benzene,
pentaerythritol triacrylate,
4-acryloxybenzophenone,
4-methacryloxybenzophenone,
N-(2-acryloxyethyl)succinimide,
trimethylolpropane triacrylate,
polyoxyethylated trimethylolpropane triacrylate,
pentaerythritol tetraacrylate,
triethylene glycol diacrylate,
triethylene glycol dimethacrylate,
trimethylolpropane trimethacrylate,
4-acryloxydiphenylmethane,
N-(2-acryloxypropyl)succinimide,
2,4-diacryloxybenzophenone,
4-(α,α-dimethylbenzyl)phenyl acrylate,
3-acryloxybenzophenone,
2-acryloxybenzophenone,
2-acryloxy-4-octyloxybenzophenone, and mixtures thereof.

The photopolymerizable composition also contains a compound containing a dinitroso group which is a non-inhibitor of free-radical polymerization but is photochemically converted by ultraviolet radiation to an inhibitor of free-radical polymerization. The dinitroso group can be of the structure

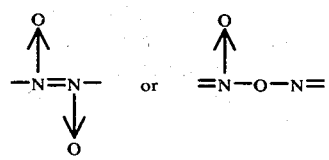

The structure of the remainder of the compound is not important provided it does not contain groups which inhibit free-radical polymerization. The actual form of the dinitroso group of the structure

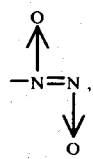

whether cis or trans, is immaterial, but the form is believed to be mainly trans except when constructed to the cis form by a ring structure.

Most commonly, the dinitroso compound is a nitroso dimer which is in thermal equilibrium with a nitroso monomer. These nitroso dimers generally have a dissociation constant of about $10^{-2}$–$10^{-10}$ and a dissociation halflife of at least about 30 seconds in solution at 25° C. The dissociation half-life of the dimer can be determined using known techniques, for example, by measuring the rate of colored nitroso monomer formation by visible spectroscopy.

A typical nitroso dimer of the first structure photodissociates in accordance with the equation:

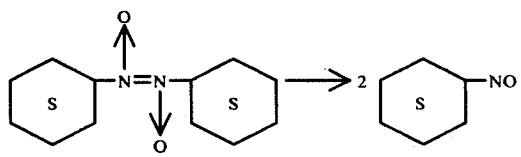

The nitroso monomer may contain one or more nitroso groups. When the nitroso monomer contains two or more nitroso groups, the association of the nitroso in the nitroso dimer may be intramolecular rather than intermolecular. A typical nitroso dimer of the fist structure in which the association of the nitroso groups is intramolecular photodissociates in accordance with the equation:

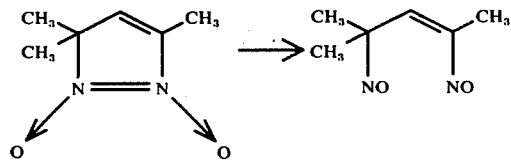

A typical nitroso dimer of the second structure photodissociates in accordance with the equation:

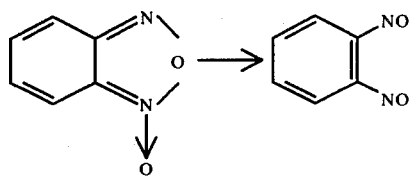

The preferred nitroso dimers are those which, in the monomeric form, have at least one nitroso group attached to a primary or secondary carbon atom, although nitroso dimers in which the nitroso group is attached to an activated tertiary carbon atom are also useful.

The most preferred dinitroso compounds are those in which at least one of the nitrogen atoms, in the noninhibitor or inhibitor form is attached to a 6-membered aromatic ring or to the beta carbon of a vinyl group attached to a 6-membered aromatic ring. These compounds are referred to herein, for simplicity, as aromatic dinitroso compounds. Aromatic dinitroso compounds are preferred because they are sensitive to radiation having wavelengths in the range of about 3200–3800A which are readily passed by polyethylene terephthalate film. Radiation wavelengths below about 3200A are largely screened out by polyethylene terephthalate. Thus, the aromatic dinitroso compounds are most suitable for use with most modern image-bearing transparency materials.

Suitable examples of dinitroso compounds include:

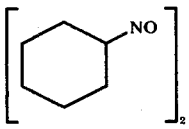
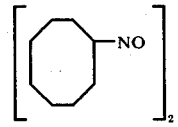

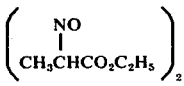
(n-C$_3$H$_7$CH(NO)C$_3$H$_7$)$_2$

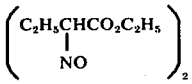
((CH$_3$)$_2$CHNO)$_2$ (CH$_3$CH(NO)C$_2$H$_5$)$_2$

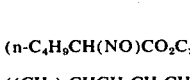
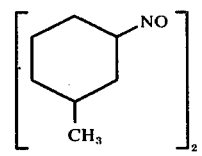

(n-C$_4$H$_9$CH(NO)CO$_2$C$_2$H$_5$)$_2$ ((CH$_3$)$_2$CHCH$_2$CH$_2$CH(NO)CO$_2$C$_2$H$_5$)$_2$ (C$_2$H$_5$O$_2$CCH$_2$CH(NO)CO$_2$C$_2$H$_5$)$_2$ (CH$_3$COCH(CO$_2$C$_2$H$_5$)CH(NO)CO$_2$C$_2$H$_5$)$_2$ ((CH$_3$)$_2$CHCH(NO)CH$_3$)$_2$

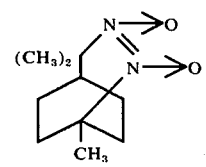

(CH$_3$COCH(NO)COC$_6$H$_5$)$_2$ (C$_6$H$_5$COCH(NO)COC$_6$H$_5$)$_2$ (p-CH$_3$OC$_6$H$_4$COCH(NO)COC$_6$H$_5$)$_2$

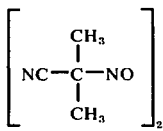
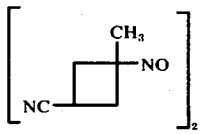
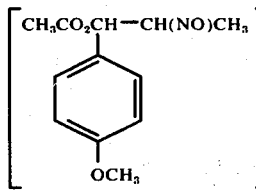
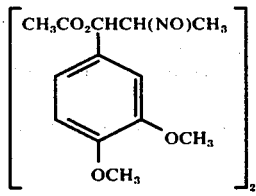
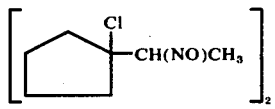
(n-C$_4$H$_9$CH(NO)CH$_2$CH$_2$CH$_2$OH)$_2$
(n-C$_6$H$_{13}$CH(NO)CH$_3$)$_2$
(CH$_3$CH(NO)Cl)$_2$
(HO(CH$_2$)$_6$NO)$_2$
((CH$_3$)$_3$CCH$_2$CH(NO)C(CH$_3$)$_2$ONO$_2$)$_2$
(CH$_3$CH(Cl)CH(NO)CH$_3$)$_2$
(CH$_3$CH(Cl)CH(NO)C$_2$H$_5$)$_2$
(C$_6$H$_5$CH(Cl)CH(NO)CH$_3$)$_2$
((CH$_3$)$_2$C(Cl)CH(NO)CH$_3$)$_2$
-continued
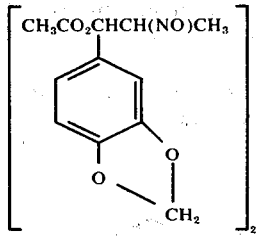
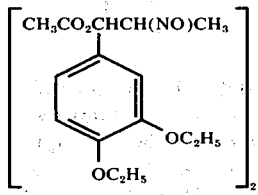
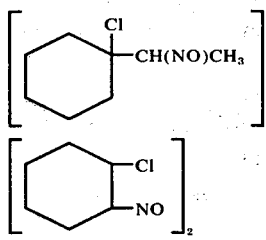
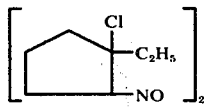
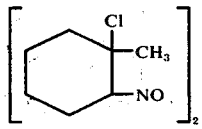
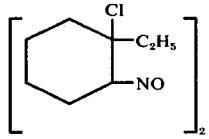
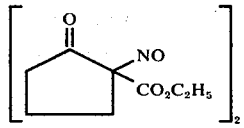
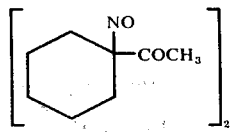
(C$_2$H$_5$COC(CH$_3$)(NO)CH$_3$)$_2$

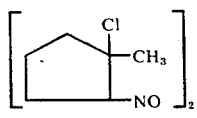
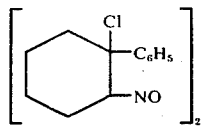
((CH₃)₂CHCOC(CH₃)(NO)CH₃)₂
(CH₃COC(CH₃)(NO)CH₃)₂
((CH₃)₂CHCH₂COC(CH₃)(NO)CH₃)₂
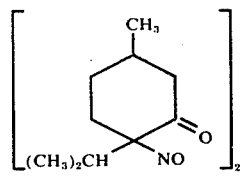
(C₆H₅COC(CH₃)(NO)CO₂C₂H₅)₂
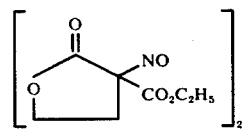
(CH₃C(CH(CH₃)₂)₂CH₂NO)₂
(CH₃(CH₂)₁₆CH₂NO)₂
(CH₃(CH₂)₁₀CH₂NO)₂
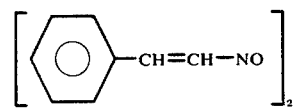
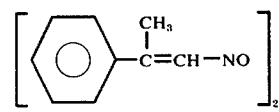
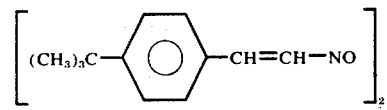
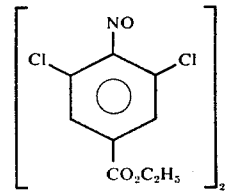
-continued
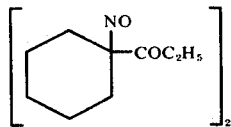
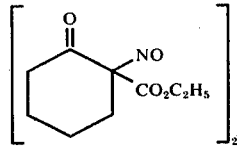
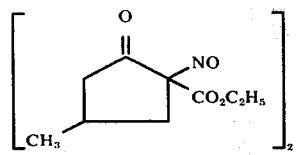
([(CH₃)₃C]₂CHNO)₂
(CH₃NO)₂
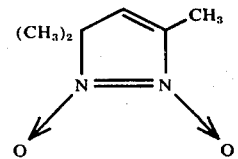
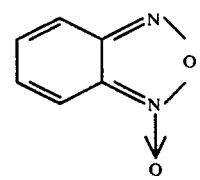
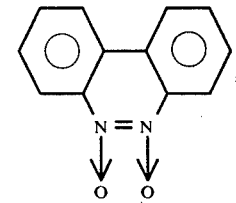
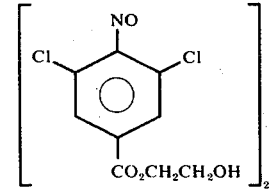

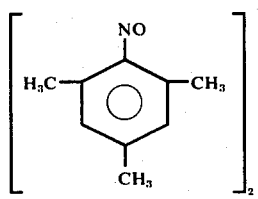
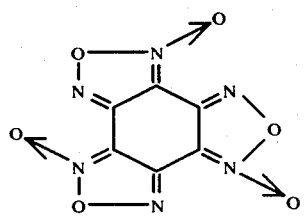
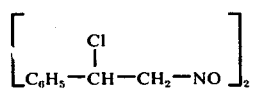
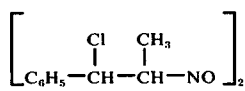
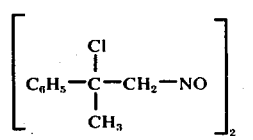
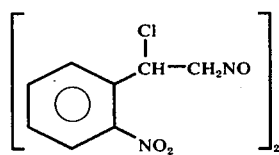
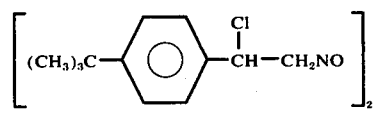
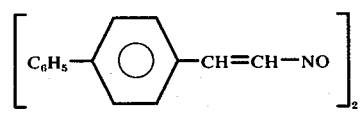
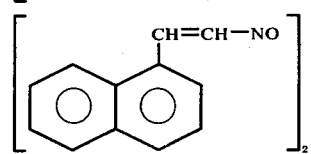
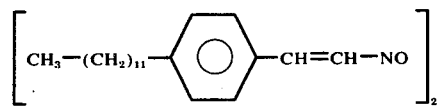
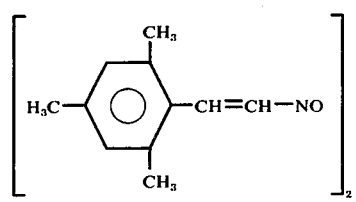
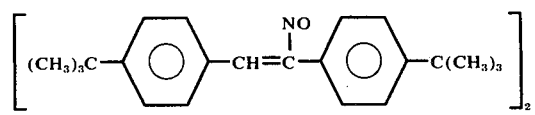
-continued
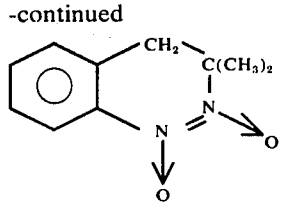
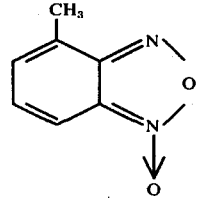
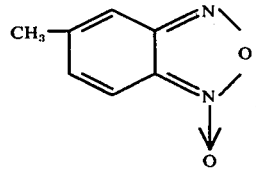
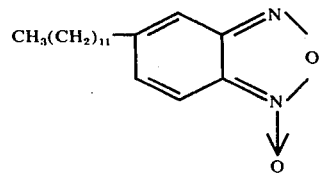

-continued
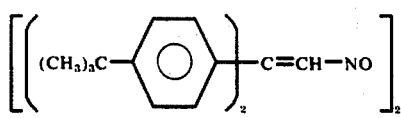
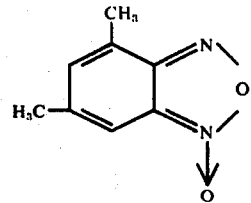
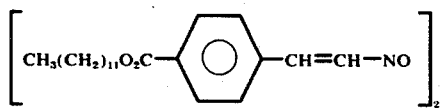
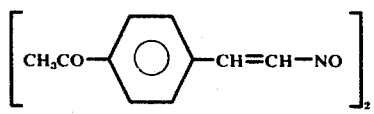
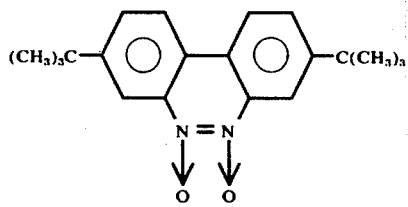 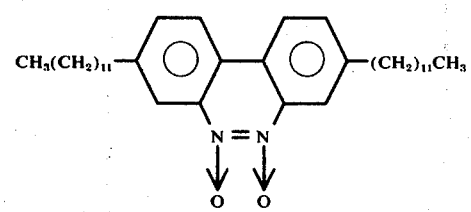
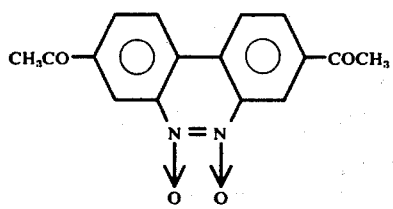 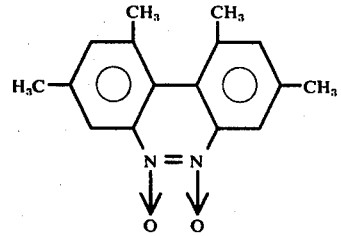
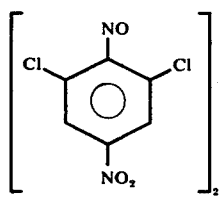 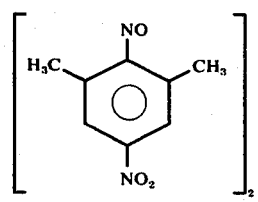
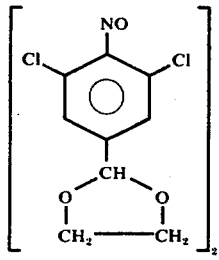 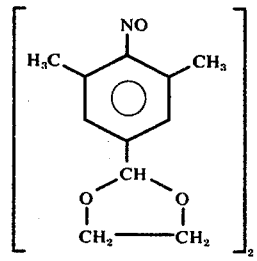
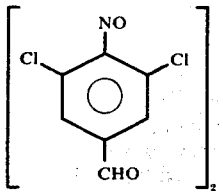 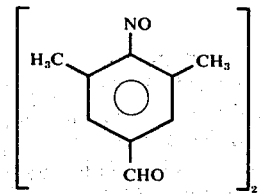

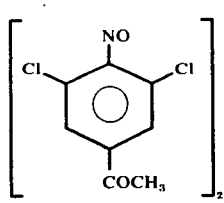
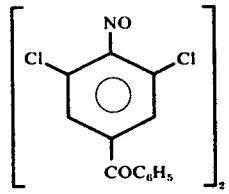
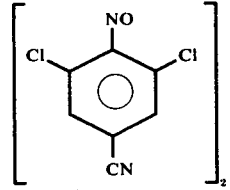
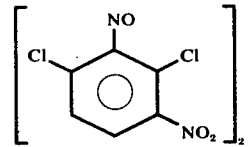

-continued

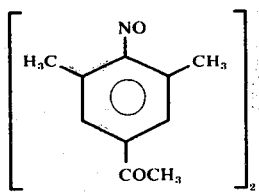
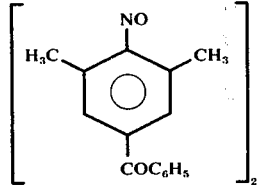
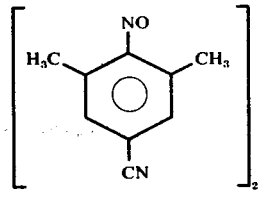
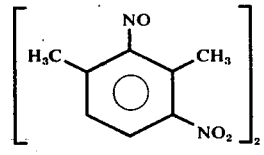

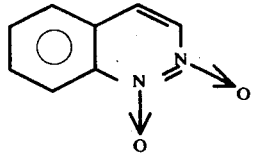
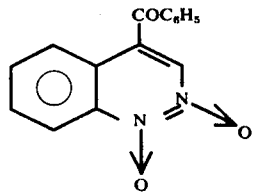
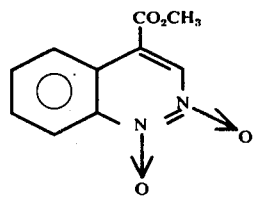
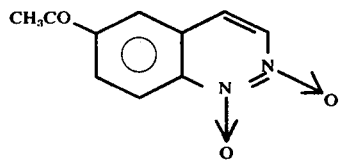

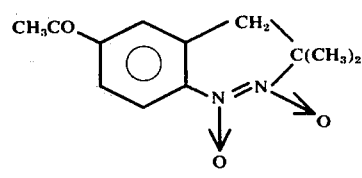
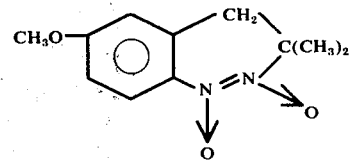
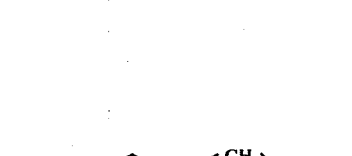
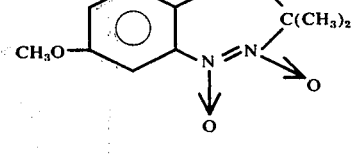

The dinitroso compound is ordinarily employed in concentrations of about 0.1–10% by weight based on the dry photopolymerizable composition. The preferred amount in any specific case will depend upon the particular unsaturated compound/free-radical generating system employed and whether it is a simple system, a binder system, or an essentially crystalline system. In general, the preferred amount of dinitroso compound will be about 0.2–2% by weight based on the photopolymerizable composition.

The photopolymerizable composition also contains an organic free-radical generating system which initiates the polymerization of the unsaturated compound and does not subsequently terminate the polymerization. The word "organic" is used here and in the claims to designate compounds which contain carbon, and one or more of oxygen, hydrogen, nitrogen, sulfur and halogen, but are free of metal.

The free-radical generating system absorbs radiation within the range of about 2000–8000A and has at least one component that has an active radiation absorption band with a molar extinction coefficient of at least about 50 within the range of about 3400–8000A, and preferably 3800–5000A. "Active radiation absorption band" means a band of radiation which is active to produce the free radicals necessary to initiate the polymerization of the unsaturated material. The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such compounds can be utilized in the practice of this invention including aromatic ketones such as benzophenone, Michler's ketone (4,4'-bis(dimethylamino)benzophenone), 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, phenanthrenequinone, and other aromatic ketones; benzoin, benzoin ethers such as benzoin methyl either, benzoin ethyl ether and benzoin phenyl ether, methylbenzoin, ethylbenzoin and other benzoins; 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Pat. Nos. 997,396, published July 7, 1965, and 1,047,569, published Nov. 9, 1966; and bis(p-aminophenyl-α,β-unsaturated) ketones as described in U.S. Pat. No. 3,652,275.

The imidazolyl dimers may be used with compounds such as 2-mercaptobenzoxazole with or without sensitizers such as Michler's ketone and various dyes. Additional examples of suitable initiators are disclosed by Plambeck in U.S. Pat. No. 2,760,863. Redox systems may also be used. These include combinations such as Rose Bengal/2-dibutylaminoethanol; phenanthrenequinone/triethanolamine; 2-(o-chlorophenyl)4,5-di(m-methoxyphenyl)imidazolyl dimer/2-mercaptobenzoxazole; 2-(o-chlorophenyl)-4,5-diphenylimidazolyl dimer/2,5-bis(4'-diethylamino-2'-methylbenzylidene)cyclopentanone; and the like.

A preferred group of free-radical generating systems characterized by good efficiency includes methyl, ethyl and phenyl benzoin ethers, methylbenzoin and its ethers, phenanthrenequinone, phenanthrenequinone/triethanolamine, and 2,4,5-triarylimidazolyl dimers/2-mercaptobenzoxazole. The concentration of the free-radical generating system employed should be about 0.001–1.0 part by weight per part of unsaturated compound, preferably about 0.01–0.7 part by weight.

The photopolymerizable compositions used herein can also contain other components, if desired. For example, the composition can be of the unsaturated compound/binder type which contains a thermoplastic macromolecular organic polymer binder. The composition can also be of the substantially dry, predominately crystalline type, described by Hertler in Belgian Pat. No. 769,694 which contains a solid ethylenically unsaturated compound, an organic radiation-sensitive free-radical generating system, and a nonpolymeric normally liquid or solid organic substance which does not inhibit the polymerization of the unsaturated compound, in addition to a suitable nitroso dimer.

Suitable thermoplastic macromolecular organic polymer binders for use in an unsaturated compound/binder system are described by Chang in U.S. Pat. No. 3,661,588, and include such polymeric types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and α-alkylpolyacrylate esters, e.g., polymethyl methacrylate, polyethyl methacrylate, and polymethyl methacrylate/ethylacrylate copolymers; (k) high molecular weight polyethylene oxides of polyglycols having average molecular weights of about 4000–1,000,000; (1) polyvinyl chloride and copolymers; (m) polyvinyl acetal; (n) polyformaldehydes; (o) polyurethanes; (p) polycarbonates; (q) polystyrenes. A preferred group of binders includes the polyacrylates and α-alkylacrylate esters, particularly polymethyl methacrylate and polymethylmethacrylate/ethylacrylate copolymers.

When an unsaturated compound/binder system is employed, the binder is normally employed in concentrations of about 3–95% by weight, based on the photopolymerizable composition, and preferably about 25–75% by weight. Unsaturated compounds which contain only one ethylenic group are generally not satisfactory for use in a binder system.

When the substantially dry, predominantly crystalline system, described in the Hertler Belgian Patent is employed, in one aspect of the invention, the system may contain in addition to the unsaturated compound, about 0.01–0.25 part by weight, per part of unsaturated compound, of a nonpolymeric, normally liquid organic compound which does not inhibit polymerization of the unsaturated compound and does not absorb so much of the incident radiation as to prevent the initiation of the polymerization by the free-radical generating system. In another aspect of the invention, about 0.01–250 parts by weight, per part of unsaturated compound, of a nonpolymerizable, crystalline organic solid which does not inhibit the polymerization of the unsaturated compound and also does not absorb the incident radiation to such an extent as to prevent the initiation of the polymerization by the free-radical generating system may be added.

Illustrative examples of suitable liquid and solid compounds, which may be added include octadecanol, triethylanolamine, stearic acid, cyclododecane, 1,10-decanediol, dimethylaminobenzonitrile, acetone oxime, desoxybenzoin, naphthalene, N,N'-dimethylhexamethylenediamine, p-diethoxybenzene, biphenyl, dotriacontane, tetramethylurea, tributylamine, 2-dimethylaminoethanol, bibenzyl, pentamethylbenzene, 1,12-dodecanediol, 1,2-diphenoxyethane, octacosane, trichloroxylene, cyclododecanol, and the like. A preferred group of solid compounds includes bibenzyl, biphenyl, 1,2-diphenoxyethane, p-diethoxybenzene, octacosane, 1-octadecanol and cyclododecanol.

When the polymer is a hard, high-melting compound, a plasticizer is usually used to lower the glass transition temperature and facilitate selective development. The plasticizer may be any of the common plasticizers compatible with the polymeric binder. Among the common plasticizers are dialkyl phthalates, alkyl phosphates, polyethylene glycol, polyethylene glycol esters, and polyethylene glycol ethers.

As is known from the work of Donaruma, J. Org. Chem., 23, 1338 (1958), applied to nitrosocyclohexane dimer, isomerization of nitroso dimers to oximes is catalyzed by acids and bases. When components containing basic amino groups are present in the photopolymerizable composition, it may be necessary to add a suitable acid in an amount sufficient to neutralize all or a portion of these amino groups in order to obtain compositions which have good shelf stability. Such amino-containing components may include the unsaturated compound, any polymeric binder employed, one or more of the components of the free-radical generating system, or any additional components such as plasticizers, adhesion promoters, etc.

For neutralization of these amino groups it is preferred to employ a mineral or organic acid with a dissociation constant in aqueous solution greater than about $1.3 \times 10^{-5}$. Dissociation constants of organic and inorganic acids in aqueous solutions can be found, e.g., in the "Handbook of Chemistry and Physics", 55th Edition 1974–1975, D129–D130, CRC Press Inc. Cleveland, Ohio. The preferred acid is trifluoroacetic acid because of the good coating characteristics of the resulting compositions.

The amount of acid necessary to provide shelf stability for the composition will depend upon the concentration of amino groups in the composition. About 0.25 to about 1.0 mole of acid per mole of amino groups is usually satisfactory, and preferably about 0.33 to about 0.67 mole per mole. When reagent grade methylene chloride is employed as a solvent in compositions which are applied to a substrate by coating, it is usually not necessary to add acid since a trace amount of acid is usually present in this solvent.

The photopolymerizable compositions described herein may be applied to a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include copper, alumina-blasted aluminum, oriented polyester film, alumina-blasted oriented polyester film, polyvinylidene chloride-coated oriented polyester film, polyvinyl alcohol-coated paper, cross-linked polyester-coated paper, nylon, glass, heavy paper such as lithographic paper, polypropylene film and the like. Preferably the substrate is polyvinylidene chloride-coated oriented polyester film or alumina-blasted aluminum.

The particular substrate will generally be determined by the use application involved. For example, the method of this invention is particularly useful for producing printed circuits using a copper-clad fiber-reinforced resin board as the substrate.

When the photopolymerizable compositions are coated on metal surfaces, they are useful for making presensitized lithographic printing plates. For example, application of a photopolymerizable layer to a grained aluminum base results in a lithographic printing plate. In use, the developed plate is first coated with water and is then contacted with a roller which wets only the photopolymer image with ink. The inked plate can then be used in lithographic printing in the usual way.

The photopolymerizable compositions can also serve as photoresists in making etched or plated circuits or in chemical milling applications. For example, the photopolymerizable composition may be applied in liquid form to a substrate followed by drying. A removable cover sheet may be applied to the surface of the resultant layer of the composition in order to protect it during handling. Upon removing the cover sheet if present, the dry layer can be laminated to another substrate for its ultimate use, using conventional laminating equipment to apply pressure and generally using heat. The original substrate now becomes a cover sheet. This technique is particularly useful in applying the compositions for use as photoresists, such as described in U.S. Pat. No. 3,469,982, wherein the original substrate is a polymeric film and the substrate to which the layer is transferred generally has a metal or ceramic surface.

The photopolymerizable compositions are also useful for preparing colored images from color separation negatives suitable for color-proofing. The images formed with these elements may also be used for making copies by thermal transfer to a substrate. Specific uses will be evident to those skilled in the art; many uses for positive images on substrates are disclosed in U.S. Pat. Nos. 2,760,863; 3,060,023; and 3,060,026.

Processes for applying a layer of photopolymerizable composition either in the liquid or dry state to a substrate are well known. Processes starting with compositions of the substantially dry, predominantly crystalline type are of five general types: those in which (1) the components of the composition are melted together generally forming a homogeneous melt which is coated onto the substrate; (2) the components of the composition are dissolved together in a solvent in which the components are preferably completely soluble and the resulting solution is poured or painted onto the substrate, which is the preferred method; (3) the components of the composition are dissolved in a volatile solvent and the resulting solution is sprayed as a fine mist against the substrate; (4) the components of the composition are melted together and the melt is sprayed as a fine mist onto the substrate; (5) the components of the composition are mixed together in a heated vessel which contains an inner surface that is cooled in which the distance from the mixture to the cooled surface can be varied whereby the components are sublimed onto the cooled surface. Further details of these processes can be found in the Belgian Patent of Hertler, cited above.

The photopolymerizable compositions of this invention are exposed to radiation in the wavelength range of about 2000–8000A. Suitable sources of such radiation, in addition to sunlight, include carbon arcs, mercury-vapor arcs, fluorescent lamps with ultraviolet radiation-emitting phosphors, argon glow lamps, electronic flash units and photographic flood lamps. Other fluorescent radiation sources such as the tracings on the face of a cathode ray tube may be used. Electron accelerators and electron beam sources through an appropriate mask may also be used.

Where artificial radiation sources are used, the distance between the photopolymerizable layer and the radiation source may be varied according to the radiation sensitivity of the composition and the nature of the unsaturated compound. Customarily, mercury-vapor arcs are used at a distance of about 1.5–20 inches (3.8–50.8 cm) from the photopolymerizable layer. Radiation fluxes of about 10–10,000 $\mu w/cm^2$ are generally suitable for use.

The radiation used during the imagewise exposure may have wavelengths over the entire range of about 2000–8000A, provided at least some of the radiation is of wavelengths of ultraviolet radiation that photochemically convert the dinitroso compound to inhibitor. The radiation used during the exposure that activates the free-radical generating system should be substantially limited to wavelengths that do not convert the dinitroso compound to inhibitor. For example, if wavelengths of about 3400A and shorter cause conversion of the dinitroso compound, then the exposure activating the free-radical generating system should preferably exclude greater than about 99% of the radiation below about 3400A. Likewise, if wavelengths of about 3800A and shorter cause the conversion, then the actinic radiation exposure should preferably exclude greater than about 99% of the radiation below about 3800A. During the activating exposure, a greater portion of the photopolymerizable layer, typically the entire layer, is struck by the radiation with the result that free radicals are generated and polymerization takes place in the portion struck by the activating radiation but not by the imagewise exposure radiation.

The length of time the compositions are exposed to radiation may vary upward from a fraction of a second. The exposure time will vary depending on the nature and concentration of the unsaturated compound and the free-radical generating system, and the type of radiation. Exposure can occur over a wide range of temperatures, as for example, from about −80° C up to about 45° C. Preferred exposure temperatures range from about −30° C to about 35° C. There is an obvious economic advantage to operating the process at room temperature. However, because of the slower rate at which nitroso monomers reassociate to nitroso dimers at lower temperatures, for example about 0° to −30° C, improved image relief can be achieved by using nitroso dimers at these temperatures. Accordingly, these lower temperatures will be preferred where improved relief, such as that required when operating on a micro scale, is desired.

Imagewise exposure is conveniently carried out by exposing a layer of the photopolymerizable composition to ultraviolet radiation through a process transparency; that is, an image-bearing transparency consisting solely of areas substantially opaque and substantially transparent to the radiation being used, where the opaque areas are substantially of the same optical density; for example, a so-called line or halftone negative or positive. Process transparencies may be constructed of any suitable materials including cellulose acetate film and polyester film. Exposure of the layer of photopolymerizable composition to the full spectrum of a mercury-vapor lamp through a cellulose acetate or polyester film negative causes conversion of the dinitroso compound to inhibitor in the radiation struck areas. These areas ultimately become non-image areas since no polymerization will be initiated in these areas during the actinic radiation exposure step.

Removal of the process transparency followed by exposure to the activating radiation, e.g., radiation substantially limited to wavelengths greater than about 3400A, or about 3800A as the case may be, causes polymerization to occur in the areas which were not struck by the radiation during the imagewise exposure. Radiation of this wavelength is insufficiently absorbed by the dinitroso compound to convert it to inhibitor. The areas exposed in this manner become the image areas. Development of the twice exposed layer provides a positive image, i.e., the photopolymerized portion of the layer remaining after development corresponds to the opaque region of the process transparency.

The exposure to actinic radiation must be carried out while the amount of inhibitor present in the areas exposed to the imagewise exposure radiation is sufficient that inhibition of polymerization is effected in these areas. When the dinitroso compound is a nitroso dimer, the inhibitor species may be the nitroso monomer as such or a more persistent inhibitor species such as the nitroxide radicals formed in equations (1), (2) and (3) may be present. For best results the exposure to actinic radiation should be carried out within a reasonable time after the imagewise exposure, for example, within about one hour, preferably within about 30 minutes, and most preferably within about 15 minutes.

It is not necessary that the two exposures to radiation be carried out in sequence, i.e., the imagewise exposure first, followed by the activating exposure. It is also possible to use simultaneous exposure to radiation of the different wavelengths required. For example, exposure of the photopolymerizable layer to the full spectrum of a mercury-vapor lamp through a process transparency spaced apart from the surface of the layer may be carried out while simultaneously projecting radiation of wavelengths greater than about 3400A, or about 3800A as the case may be, onto the layer without passing through the transparency. It is also suitable during simultaneous exposures to project the actinic radiation from the reverse side of the substrate when the substrate supporting the photopolymerizable layer is transparent to such radiation.

The exposed photosensitive layer can be developed by removing the unpolymerized unsaturated compound from the layer, leaving behind a polymeric replica of the opaque areas of the process transparency; i.e., a positive image. The unpolymerized unsaturated compound can be removed by heating under conditions which result in some or all of the volatile components being vaporized whereby the photopolymer is left behind. The conditions of thermal development selected will depend upon the nature of the substrate, the volatility of the components to be removed, and the thermal stability of the components. Alternatively, development may be achieved by solvent washout, thermal transfer, pressure transfer, differential adhesion of the exposed versus unexposed areas, and the like. Preferably, positive polymeric images are developed by solvent washout. Negative images are preferably developed by differential adhesion of a pigment toner to the tacky unpolymerized areas.

The following examples further illustrate the method of this invention. All percentages are by weight unless otherwise specified.

EXAMPLE 1

A mixture of 0.851 g of 1,2-diphenoxyethane, 0.082 g of 2,4-dimethyl-2-nitroso-3-pentanone dimer, 0.082 g of 4-($\alpha,\alpha$-dimethylbenzyl)phenyl acrylate, and 0.040 g of benzoin methyl ether was dissolved in 15 ml of chloroform and the solution was sprayed onto a 12.7 × 12.7 cm aluminum plate. The plate was heated to melt the coating, and it was cooled to give a uniform melt-crystallized coating. The plate was exposed for 3 minutes to 3130A radiation from a high pressure mercury lamp (light flux of 46 $\mu$w/cm$^2$) with a portion of the plate covered and obscured from the radiation. To eliminate shorter and longer wavelength radiation 0–54 and 7–54 filters available from Corning Glass Works and a nickel sulfate/potassium chromate/potassium biphthalate filter solution were used. The filters were replaced with 0–53 and 7–51 filters and a 3660A interference filter to give an output limited to 3660A radiation (38 $\mu$w/cm$^2$ light flux) and the entire plate was irradiated for 2.0 minutes. The plate was developed by washout with a 90% n-hexane/10% chloroform solution. A positive image was produced in which polymer was present in the area not exposed to the 3130A first irradiation.

EXAMPLE 2

This example illustrates the use of 4-acryloxybenzophenone as the unsaturated compound.

A plate was coated as described in Example 1 with a solution of 0.800 g of 1,2-diphenoxyethane, 0.080 g of 4-acryloxybenzophenone, 0.040 g of 2,4-dimethyl-2-nitroso-3-pentanone dimer and 0.040 g of benzoin methyl ether in 15 ml of chloroform. A high-quality positive image was prepared by exposure of the plate to 3130A radiation for 3.0 minutes through a cellulose acetate process transparency, followed by exposure for 1.0 minute to radiation limited to 3660A with the process transparency removed. The plate was developed by washing with 90% hexane/10% chloroform solution.

EXAMPLE 3

This example illustrates the use of nitrosocyclohexane dimer as the nitroso dimer. Nitrosocyclohexane dimer (trans form) has an equilibrium constant of 10$^{-7}$ and a dissociation half-life of 10 hours in acetonitrile at room temperature (Wajer et al., Rec. Trav. Chim., Vol. 91, pp. 565-577, 1972).

A plate was coated as described in Example 1 with a solution of 0.800 g of 1,2-diphenoxyethane, 0.080 g of 4-($\alpha,\alpha$-dimethylbenzyl)phenyl acrylate, 0.060 g of nitrosocyclohexane dimer and 0.040 g of benzoin methyl ether in 15 ml of chloroform. A high-quality positive image was prepared by exposure of the plate to 3130A radiation for 3.0 minutes through a cellulose acetate process transparency which is followed by exposure for 1.0 minute to radiation limited to 3660A with the process transparency removed. The plate was developed by washing with 90% hexane/10% chloroform solution.

EXAMPLE 4

This example illustrates the use of 4,4'-bis-(acryloxy)-2,2-diphenylpropane as the unsaturated compound.

A plate was coated as in Example 1 with a solution of 0.800 g of 1,2-diphenoxyethane, 0.060 g of nitrosocyclohexane dimer, 0.040 g of benzoin methyl ether and 0.080 g of 4,4'-bis(acryloxy)-2,2-diphenylpropane in 15 ml of chloroform to form a crystalline system. The plate was irradiated with the full spectrum of the high pressure mercury lamp, without filters, for 1 minute through a cellulose acetate process transparency (300 $\mu$w/cm$^2$ light flux). The process transparency was removed and the irradiation was continued for 0.5 minute using light limited to wavelengths greater than 3400A, obtained by use of a Corning 0–52 filter. After development with a 50% hexane/50% chloroform solution, a high-quality positive image remained.

EXAMPLE 5

This example illustrates the use of pentaerythritol triacrylate as the unsaturated compound in a crystalline system.

1-Nitroso-3-methylcyclohexane dimer was prepared as follows: Acetic anhydride (55 g) was added over a thirty minute period, to a solution of 12.2 ml of 90% hydrogen peroxide and one drop of concentrated sulfuric acid in 50 ml of methylene chloride, while the temperature was maintained at 0° C. This solution was then added slowly to 22.8 g of 3-methylcyclohexylamine in 75 ml of methylene chloride while the temperature was maintained at 15° C. After the addition of the peracetic acid solution was completed, the reaction mixture was allowed to warm to room temperature and stirred an additional 10 hours. The solution was extracted with 200 ml of water, 100 ml of cold 15% ammonium hydroxide, 100 ml of 10% sulfuric acid and 100 ml of water and dried over anhydrous magnesium sulfate. The methylene chloride was removed by distillation to leave a pale blue solid. This solid was recrystallized from methanol-water to give 5.0 g of 1-nitroso-3-methylcyclohexane dimer as a white solid, mp 81°–83° C. The structure was confirmed by IR, UV and NMR spectra.

Anal. Calcd for $C_{14}H_{26}N_2O_2$: C, 66.10; H, 10.30; N, 11.01; Found: C, 66.06; H, 10.41; N, 10.77; C, 66.15; H, 10.22; N, 10.78

A mixture of 0.800 g of 1,2-diphenoxyethane, 0.060 g of 1-nitroso-3-methylcyclohexane dimer, prepared as described above, 0.040 g of benzoin methyl ether and 0.100 g of pentaerythritol triacrylate, HOCH$_2$C(CH$_2$O$_2$CCH=CH$_2$)$_3$, was dissolved in a mixture of 6 ml of methyl ethyl ketone and 1 ml of 2-ethoxyethanol and the solution was poured onto a 30.5 × 30.5 cm aluminum plate. The solvent was evaporated by heating the plate at 80° C. with an infrared lamp. The residual coating crystallized.

The plate was exposed through a cellulose acetate process transparency to the full spectrum of a high pressure mercury lamp for 1 minute. The process transparency was removed, and the plate was reexposed to radiation limited to wavelengths greater than 3400A (Corning 0-52 filter) for 20 seconds. After development with 50% hexane/50% chloroform solution, a high-quality positive image was obtained.

EXAMPLE 6

This example illustrates the use of a triarylimidazolyl dimer and 2-mercaptobenzoxazole as the free-radical generating system.

A mixture of 0.800 g of 1,2-diphenoxyethane, 0.100 g of 4-($\alpha,\alpha$-dimethylbenzyl)phenyl acrylate, 0.060 g of 1-nitroso-3-methylcyclohexane dimer, 0.015 g of 2-o-chlorophenyl-4,5-bis(m-methoxyphenyl)imidazolyl dimer and 0.005 g of 2-mercaptobenzoxazole was dissolved in a mixture of 6 ml of methyl ethyl ketone and 1 ml of 2-ethoxyethanol, and the solution was poured onto a 30.5 × 30.5 cm aluminum plate. The solvent was evaporated by heating the plate at 80° C with an infrared lamp. The residual coating crystallized.

The plate was exposed through a paper process transparency to the full spectrum of a mercury lamp for 1 minute, followed by a 15-second exposure to radiation limited to wavelengths greater than 3400A (Corning 0–52) without the process transparency. A high-quality positive image was obtained after development.

EXAMPLE 7

This example illustrates the use of polymethyl methacrylate in a binder system.

A mixture of 1.25 g of trimethylolpropane triacrylate, 0.80 g of triethylene glycol diacrylate, 0.125 g of benzoin methyl ether, 0.05 g of 1-nitroso-3-methylcyclohexane dimer, and 2.78 g of polymethyl methacrylate resin was dissolved in 20 ml of methylene chloride and the solution was coated onto a 30.5 × 30.5 cm aluminum plate with a doctor knife set at 0.127 cm thickness. The solvent was evaporated and the residual film was coated with an aqueous polyvinyl alcohol solution.

The plate was exposed through a cellulose acetate process transparency to the full spectrum of a medium pressure mercury lamp for 4 minutes, the transparency was removed, and the plate was exposed for 2 minutes to radiation limited to wavelengths greater than 3400A (Corning 0–52 filter). The plate was developed by washing with water followed by methyl chloroform. A high-quality positive image was obtained.

EXAMPLE 8

The composition of Example 7 was used except that three times as much 1-nitroso-3-methylcyclohexane dimer (0.15 g) was employed. A 30.5 × 30.5 cm aluminum plate was coated as described in Example 7.

A portion of the plate was irradiated with the full spectrum of a medium mercury lamp for 2 minutes through a cellulose acetate process transparency, the transparency was removed, and the plate was exposed for 4 minutes to radiation limited to wavelengths greater than 3400A (Corning 0–52 filter). The plate was developed by washout with water followed by methyl chloroform. A high-quality positive image was obtained.

Another portion of the plate was exposed through a polyester process transparency to the full spectrum of the lamp for 4 minutes, the transparency was removed, and the plate was exposed for 3 minutes to radiation limited to wavelengths greater than 3400A. After development as above, a high-quality positive image was obtained.

EXAMPLE 9

The composition of Example 7 was employed except that the 1-nitroso-3-methylcyclohexane dimer was replaced by 0.15 g of nitrosocyclohexane dimer. A 30.5 × 30.5 cm aluminum plate was coated as described in Example 7.

The plate was irradiated through a polyester process transparency with the full spectrum of a medium pressure mercury lamp for 4 minutes, the transparency was removed, and the plate was exposed for 4 minutes to radiation limited to wavelengths greater than 3400A. The plate was developed by washout with water followed by methyl chloroform. A high-quality positive image was obtained.

EXAMPLE 10

This example illustrates the use of 2-nitroso-3-methylbutane dimer as the nitroso dimer.

A mixture of 1.25 g of trimethylolpropane triacrylate, 0.80 g of triethylene glycol diacrylate, 2.78 g of polymethyl methacrylate resin, 0.125 g of benzoin methyl ether and 0.100 g of 2-nitroso-3-methylbutane dimer was dissolved in 20 ml of methylene chloride and the solution was coated onto an aluminum plate as described in Example 7.

The plate was exposed through a cellulose acetate process transparency to the full spectrum of a medium pressure mercury lamp for 4 minutes, the transparency was removed, and the plate was exposed for 3 minutes to radiation limited to wavelengths greater than 3400A. The plate was developed by washout with water followed by methyl chloroform. A high-quality positive image was obtained.

EXAMPLE 11

This example illustrates the use of simultaneous exposure with radiation of different wavelengths.

The composition of Example 8 was used. A 30.5 × 30.5 cm aluminum plate was coated as described in Example 7. The plate was exposed through a process transparency spaced from the surface of the photopolymerizable layer to the full spectrum radiation of a medium pressure mercury lamp, while the plate was simultaneously exposed to radiation limited to wavelengths greater than 3400A (Corning 0–52 filter) for 4.0 minutes by directing the radiation into the space between the transparency and the photopolymerizable layer. A high-quality positive image was obtained in which no polymer was present in the area struck by the full spectrum radiation and polymer was present in the area struck by radiation of wavelength greater than 3400A.

EXAMPLE 12

This example illustrates the improved relief obtained by photoimaging at 0° C.

A stock solution of a mixture of 1.25 g of trimethylolpropane triacrylate, 0.8 g of triethyleneglycol diacetate, and 2.77 g of polymethyl methacrylate resin dissolved in 20 ml of methylene chloride was prepared. To one-half of this solution, 0.18 g of benzoin methyl ether was added. The resulting solution was again divided in half and to one-half 0.02 g of nitrosocyclohexane dimer was added and this solution used to coat an aluminum plate. The solution was evaporated at 25° C, and the coating, ~1 mil (0.0254 mm) in thickness, was subsequently top-coated with an aqueous polyvinyl alcohol solution to a thickness of less than 0.05 mil (0.00127 mm). The coated plate was cooled at 0° C in a nitrogen atmosphere and exposed to a 100 W AH4 medium pressure mercury resonance lamp through a 0.636 cm quartz plate and a test pattern transparency on a cellulose acetate base. The lamp was placed 6.36 cm from the coated plate.

The plate was exposed initially for 2 minutes, the transparency removed and replaced by a Corning 0–52 filter to remove radiation of less than 3400A, and the plate reexposed for 1.5 minutes. After development, a high quality positive image was obtained with 0.0254 mm relief.

EXAMPLE 13

This example illustrates the preparation of a printed circuit.

A mixture of 36.61 g of trimethylolpropane triacrylate, 5.23 g of polymethyl methacrylate resin, 52.71 g of a polymethyl methacrylate/acrylic acid copolymer resin, 5.23 g of a conventional plasticizer, 0.21 g of a conventional adhesion promoter, 2.5 g of benzoin methyl ether and 3.0 g of nitrosocyclohexane dimer was dissolved in 900 ml of methylene chloride. A portion of this solution was applied to an epoxy resin board laminated with copper from a doctor knife set at 10 mils (0.254 mm). The dried coating was subsequently top-coated with a 5% aqueous polyvinyl alcohol solution from a doctor knife set at 1 mil (0.0254 mm).

The board was exposed through a cellulose acetate process transparency to the full spectrum of a 100 watt high pressure mercury resonance lamp for 4 minutes, the transparency was removed, and the board was exposed for 6 minutes to radiation limited to wavelengths greater than 3400A (Corning 0-52 filter). The board was developed by washout with water followed by a solution of 40 g of borax and 500 g of 2-ethoxyethanol in 4 liters of water. A positive image resulted.

The board was etched with a ferric chloride solution until all the copper had been dissolved from the areas not covered by polymer. Residual polymer was removed by washout with methylene chloride to leave a positive copper image, i.e., copper was present in the areas not struck by radiation during the first exposure.

EXAMPLES 14–25

These examples illustrate the use of aromatic dinitroso compounds.

A stock solution was prepared containing the following ingredients:

| Component | Amount (g) |
|---|---|
| Pentaerythritol triacrylate | 25 |
| Methyl methacrylate polymer (low mol. wt.; density = 1.13 g/cc) | 25 |
| Triethylene glycol diacetate | 6.5 |
| Methylene Chloride | 508.5 |

Photopolymerizable solutions were prepared using the above stock solution (10-g portions), 2,7-di-t-butylphenanthrenequinone as the free-radical generating system (initiator), and a dinitroso compound; the amounts of initiator and dinitroso compound added, as well as the structure of the latter, are indicated in Table I.

Each photopolymerizable solution was coated with a doctor knife onto oriented, heat-set, polyethylene terephthalate film (0.076 mm thick). After air drying (dry coating thickness ca. 0.0076 mm), a cover sheet of polyethylene (0.025 mm thick) was laminated over the dried layer; lamination was conducted at room temperature with modest pressure, i.e., via a hand-held squeegee applicator. All samples were exposed within two minutes after lamination.

Each film was initially exposed in a vacuum frame through a 21-step $\sqrt{2}$ stepwedge process transparency, in which the transmittance of radiation between steps differs by a factor of $\sqrt{2}$, to radiation of wavelength essentially between 3200–3800A; this initial exposure source was a device containing eight Sylvania Blacklite Blue lamps (Model No. F15T8-BLB) spaced 5.08 cm from the sample film. This exposure (see Table I for exposure time) produced inhibitor in the film in amounts inversely related to the optical densities of the steps on the step wedge. In other words, as the optical density of the steps in the transparency increased, the concentration of inhibitor decreased in the corresponding portion of the film.

The transparency was then removed and the sample was irradiated with actinic radiation limited to wavelengths greater than 3800A. The radiation source was a commercial nuArc vacuum frame (Model FT26L) containing a 2000 watt, pulsed-xenon source, spaced 43.2 cm from the polymerizable layer. Radiation of wavelengths less than 3800A was excluded by inserting an appropriate filter between the source and sample; a Wratten Light Filter either 1A or 2C, manufactured by Eastman Kodak Co., was used. The exposure times are listed in Table I. Photopolymerization occurred only where the concentration of inhibitor was negligible or very low.

Following exposure, the polyethylene cover sheet was removed and a blue pigment toner, as described in U.S. Pat. No. 3,649,268, was applied to the photopolymer surface. After removing excess toner with a cotton pad, a replica of the step wedge remained; that is, toner did not adhere to the polymerized areas (higher numbered steps), but did adhere to the tacky, unpolymerized portions (lower numbered steps) which contained a high concentration of inhibitor from the initial exposure. The data which indicate that each of the dinitroso compound functioned to produce inhibitor in this two-exposure process are summarized in Table I.

TABLE I

| Example | Dinitroso Compound Structure | Dinitroso Compound Amount % | Initiator % | Exposure Time (sec) <3800A | Exposure Time (sec) >3800A | Highest Numbered Step Toned |
|---|---|---|---|---|---|---|
| 14 | A | 0.98 | 0.98 | 40 | 30 | 1 |
| 15 | A | 0.10 | 0.49 | 60 | 20 | 1 |
| 16 | A | 0.05 | 0.25 | 60 | 30 | 3 |
| 17 | A | 0.05 | 0.25 | 60 | 40 | 2 |
| 18 | B | 0.98 | 0.98 | 60 | 60 | <1 |
| 19 | B | 0.20 | 0.49 | 60 | 30 | 2 |
| 20 | B | 0.20 | 0.49 | 90 | 40 | 2 |
| 21 | C | 3.81 | 0.95 | 120 | 30 | <1 |
| 22 | C | 2.88 | 0.96 | 120 | 30 | 1 |
| 23 | D | 1.44 | 2.87 | 120 | 90 | 1 |
| 24 | E | 0.98 | 0.98 | 60 | 120 | 1 |
| 25 | F | 0.98 | 0.98 | 90 | 120 | <1 |

LEGEND TO DINITROSO COMPOUND STRUCTURES IN TABLE I

A = $(C_6H_5-CH=CH-NO)_2$, β-nitrosostyrene dimer
B = $(p-t-C_4H_9-C_6H_4-CH=CH-NO)_2$, β-nitroso-p-t-butylstyrene dimer C = 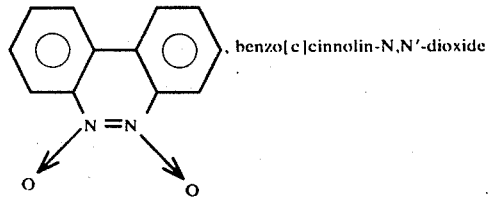, benzo[c]cinnolin-N,N'-dioxide D = 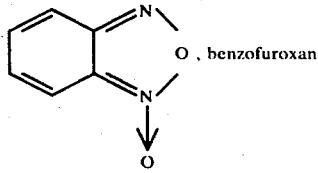, benzofuroxan E = 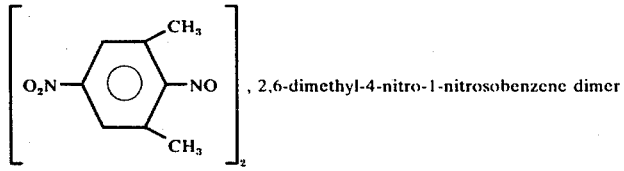, 2,6-dimethyl-4-nitro-1-nitrosobenzene dimer F = 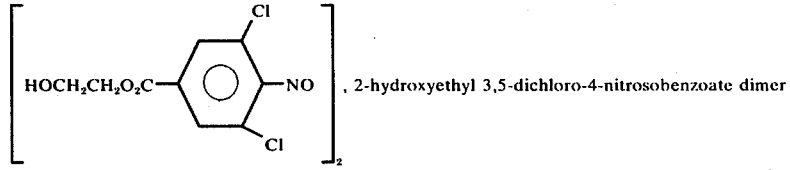, 2-hydroxyethyl 3,5-dichloro-4-nitrosobenzoate dimer The embodiments of the invention in which an exclusive property or privilege is claimed are defined as follows:

1. Method of making a positive polymeric image on a substrate which comprises
   a. applying to the substrate a layer of photopolymerizable composition containing (1) non-gaseous ethylenically unsaturated compound capable of addition polymerization by free-radical initiated chain propagation, (2) 0.1–10% by weight, based on the photopolymerizable composition, of a compound containing a dinitroso group which is a noninhibitor of free-radical polymerization and is photochemically converted by ultraviolet radiation to an inhibitor of free-radical polymerization, and (3) 0.001–1.0 part by weight, per part of unsaturated compound, of an organic free-radical generating system activatable by actinic radiation that does not convert the dinitroso compound to an inhibitor of free-radical polymerization,
   b. imagewise exposing a portion of the photopolymerizable layer through an image-bearing transparency consisting solely of substantially opaque and substantially transparent areas to ultraviolet radiation that converts the dinitroso compound to an inhibitor of free-radical polymerization, thereby inhibiting photopolymerization in the exposed areas,
   c. exposing a greater portion of the photopolymerizable layer, including the areas exposed to the imagewise exposure radiation, to actinic radiation that activates the free-radical generating system but does not convert the dinitroso compound to an inhibitor of free-radical polymerization, whereby a positive polymeric image is formed in the areas not exposed to the imagewise exposure radiation.

2. The method of claim 1 in which the free-radical generating system absorbs radiation within the range of 2000–8000A and has at least one component that has an active radiation absorption band with a molar extinction coefficient of at least 50 within the range of 3400–8000A.

3. The method of claim 2 in which the unsaturated compound is an unsaturated ester of a polyol and α-methylenecarboxylic acid.

4. The method of claim 3 in which the unsaturated compound is an acrylic ester.

5. The method of claim 4 in which the photopolymerizable composition contains 0.01–0.7 part by weight, per part of unsaturated compound, of a benzoin ether as the free-radical generating system.

6. The method of claim 5 in which the free-radical generating system is benzoin methyl ether.

7. The method of claim 4 in which the photopolymerizable composition contains 0.2–2 weight percent, based on the photopolymerizable composition, of 2,4-dimethyl-2-nitroso-3-pentanone dimer.

8. The method of claim 4 in which the photopolymerizable composition contains 0.2–2 percent by weight based on the photopolymerizable composition of nitrosocyclohexane dimer.

9. The method of claim 4 in which the photopolymerizable composition contains 0.2–2 percent by weight based on the photopolymerizable composition of 1-nitroso-3-methylcyclohexane dimer.

10. The method of claim 4 in which the photopolymerizable composition contains 0.2–2 percent by weight based on the photopolymerizable composition of 2-nitroso-3-methylbutane dimer.

11. The method of claim 1 in which the dinitroso compound is a nitroso dimer which has a dissociation constant of $10^{-2}$–$10^{-10}$ and a dissociation half-life of at least about 30 seconds in solution at 25° C, and is photodissociable to nitroso monomer which is an inhibitor of free-radical polymerization, at least some of the imagewise ultraviolet radiation has a wavelength of less than 3400A, the actinic radiation is substantially limited to wavelengths greater than 3400A, and a positive polymeric image is developed by removing the nonpolymerized portion of the photopolymerizable layer in the areas exposed to the imagewise exposure radiation.

12. The method of claim 11 in which the free-radical generating system absorbs radiation within the range of 2000–8000A and has at least one component that has an active radiation absorption band with a molar extinction coefficient of at least 50 within the range of 3400–8000A.

13. The method of claim 12 in which the unsaturated compound is an unsaturated ester of a polyol and α-methylenecarboxylic acid.

14. The method of claim 13 in which the unsaturated compound is an acrylic ester.

15. The method of claim 14 in which the photopolymerizable composition contains 0.01–0.7 part by weight, per part of unsaturated compound, of a benzoin ether as the free-radical generating system.

16. The method of claim 15 in which the free-radical generating system is benzoin methyl ether.

17. The method of claim 14 in which the photopolymerizable composition contains 0.2–2 percent by weight based on the photopolymerizable composition, of 2,4-dimethyl-2-nitroso-3-pentanone dimer.

18. The method of claim 14 in which the photopolymerizable composition contains 0.2–2 percent by weight based on the photopolymerizable composition of nitrosocyclohexane dimer.

19. The method of claim 14 in which the photopolymerizable composition contains 0.2–2 percent by weight based on the photopolymerizable composition of 1-nitroso-3-methylcyclohexane dimer.

20. The method of claim 14 in which the photopolymerizable composition contains 0.2–2 percent by weight based on the photopolymerizable composition of 2-nitroso-3-methylbutane dimer.

21. The method of claim 2 in which at least one of the nitrogen atoms in the dinitroso compound, in the noninhibitor or inhibitor form, is attached to a 6-membered aromatic ring or to the beta carbon of a vinyl group attached to a 6-membered aromatic ring, at least some of the imagewise ultraviolet radiation has a wavelength of less than 3800A, the actinic radiation is substantially limited to wavelengths greater than 3800A, and the free-radical generating system has at least one component that has an active radiation absorption band with a molar extinction coefficient of at least 50 within the range of 3800–8000A.

22. The method of claim 21 in which the aromatic dinitroso compound is β-nitrosostyrene dimer.

23. The method of claim 21 in which the aromatic dinitroso compound is β-nitroso-p-t-butylstyrene dimer.

24. The method of claim 21 in which the aromatic dinitroso compound is benzo[c]cinnolin-N,N'-dioxide.

25. The method of claim 21 in which the aromatic dinitroso compound is benzofuroxan.

26. The method of claim 21 in which the aromatic dinitroso compound is 2,6-dimethyl-4-nitro-1-nitrosobenzene dimer.

27. The method of claim 21 in which the aromatic dinitroso compound is 2-hydroxyethyl 3,5-dichloro-4-nitrosobenzoate dimer.

28. The method of claim 1 in which the image is developed by differential adhesion of a pigment toner to the unpolymerized portion of the photopolymerizable layer in the areas exposed to the imagewise exposure radiation.

* * * * *

UNITED STATES PATENT OFFICE
CERTIFICATE OF CORRECTION

PATENT NO. : 4,029,505
DATED : June 14, 1977
INVENTOR(S) : William John Nebe

It is certified that error appears in the above-identified patent and that said Letters Patent are hereby corrected as shown below:

Column 5, line 2, "constructed" should read -- constrained --.

Column 5, line 27, "fist" should read -- first --.

Column 25, line 10, "0-52)" should read -- 0-52 filter) --.

Column 25, line 22, "0.127" should read -- 0.0127 --.

Column 25, line 41, "medium mercury" should read -- medium pressure mercury --.

Column 26, line 53, "solution" should read -- solvent --.

Column 28, line 49, "compound" should read -- compounds --.

Signed and Sealed this

Seventeenth Day of January 1978

[SEAL]

Attest:

RUTH C. MASON
Attesting Officer

LUTRELLE F. PARKER
Acting Commissioner of Patents and Trademarks